(12) United States Patent
Hichri et al.

(10) Patent No.: US 8,492,280 B1
(45) Date of Patent: Jul. 23, 2013

(54) METHOD FOR SIMULTANEOUSLY FORMING FEATURES OF DIFFERENT DEPTHS IN A SEMICONDUCTOR SUBSTRATE

(75) Inventors: Habib Hichri, Poughkeepsie, NY (US); Xi Li, Somers, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/465,050

(22) Filed: May 7, 2012

(51) Int. Cl.
*H01L 21/311* (2006.01)

(52) U.S. Cl.
USPC ............................... 438/700; 216/72; 216/79

(58) Field of Classification Search
USPC ................... 216/79, 72; 438/689, 700
See application file for complete search history.

(56) References Cited

U.S. PATENT DOCUMENTS

| | | | |
|---|---|---|---|
| 7,416,676 B2 | 8/2008 | Fujihara et al. | |
| 7,732,340 B2 | 6/2010 | Nagaiwa et al. | |
| 8,009,938 B2 | 8/2011 | Davis et al. | |
| 2010/0099266 A1 | 4/2010 | Oswald et al. | |
| 2011/0193193 A1 | 8/2011 | Dube et al. | |

FOREIGN PATENT DOCUMENTS

WO  WO03056617  7/2003

*Primary Examiner* — Roberts Culbert
(74) *Attorney, Agent, or Firm* — Matthew C. Zehrer; Kevin B. Anderson

(57) ABSTRACT

Embodiments of the invention may include first providing a stack of layers including a semiconductor substrate, a buried oxide layer on the semiconductor substrate, a semiconductor-on-insulator layer on the buried-oxide layer, a nitride layer on the semiconductor-on-insulator layer, and a silicon oxide layer on the nitride layer. A first opening and second opening with a smaller cross-sectional area than the first opening are then formed in the silicon oxide layer, the nitride layer, the semiconductor-on-insulator layer, and the buried-oxide layer. The first opening and the second opening are then etched with a first etching gas. The first opening and the second opening are then etched with a second etching gas, which includes the first etching gas and a halogenated silicon compound, for example, silicon tetrafluoride or silicon tetrachloride. In one embodiment, the first etching gas includes hydrogen bromide, nitrogen trifluoride, and oxygen.

15 Claims, 4 Drawing Sheets

METHOD FOR SIMULTANEOUSLY FORMING FEATURES OF DIFFERENT DEPTHS IN A SEMICONDUCTOR SUBSTRATE

BACKGROUND

The present invention generally relates to semiconductor devices, and particularly to the formation of differently sized features in a semiconductor substrate.

It may be necessary when manufacturing microelectronic devices to form features of different sizes and different depths in a silicon substrate. The ability to form differently sized features simultaneously is desirable. One exemplary structure sometimes requiring two differently sized features is an embedded dynamic random access memory device (eDRAM). An eDRAM device includes a number of individual cells having a capacitor that requires a trench etched in a semiconductor substrate. To isolate the cells from other devices on the same substrate, a moat may be formed around the cells and filled with an insulating material. In order for the moat to effectively isolate the eDRAM cells, the moat may be deeper and wider than each eDRAM cell. Therefore, it may be desirable to have a method for simultaneously forming broader and deeper moats, along with narrower and shallower trenches.

BRIEF SUMMARY

The present invention relates to forming two differently sized features in a semiconductor substrate, where the first feature is deeper and has a larger opening than the second feature. One embodiment of the invention may include first providing a stack of layers including a semiconductor substrate, a buried oxide layer on the semiconductor substrate, a semiconductor-on-insulator layer on the buried oxide layer, a nitride layer on the semiconductor-on-insulator layer, and a silicon oxide layer on the nitride layer. A first opening and second opening with a smaller cross-sectional area than the first opening are then formed in the silicon oxide layer, the nitride layer, the semiconductor-on-insulator layer, and the buried oxide layer. The first opening and the second opening are then etched with a first etching gas. The first opening and the second opening are then etched with a second etching gas, which includes the first etching gas and a halogenated silicon compound. In one embodiment, the first etching gas includes hydrogen bromide, nitrogen trifluoride, and oxygen. In one embodiment, the halogenated silicon compound of the second etching gas is silicon tetrafluoride or silicon tetrachloride.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying figures, in which.

Figure 1A:
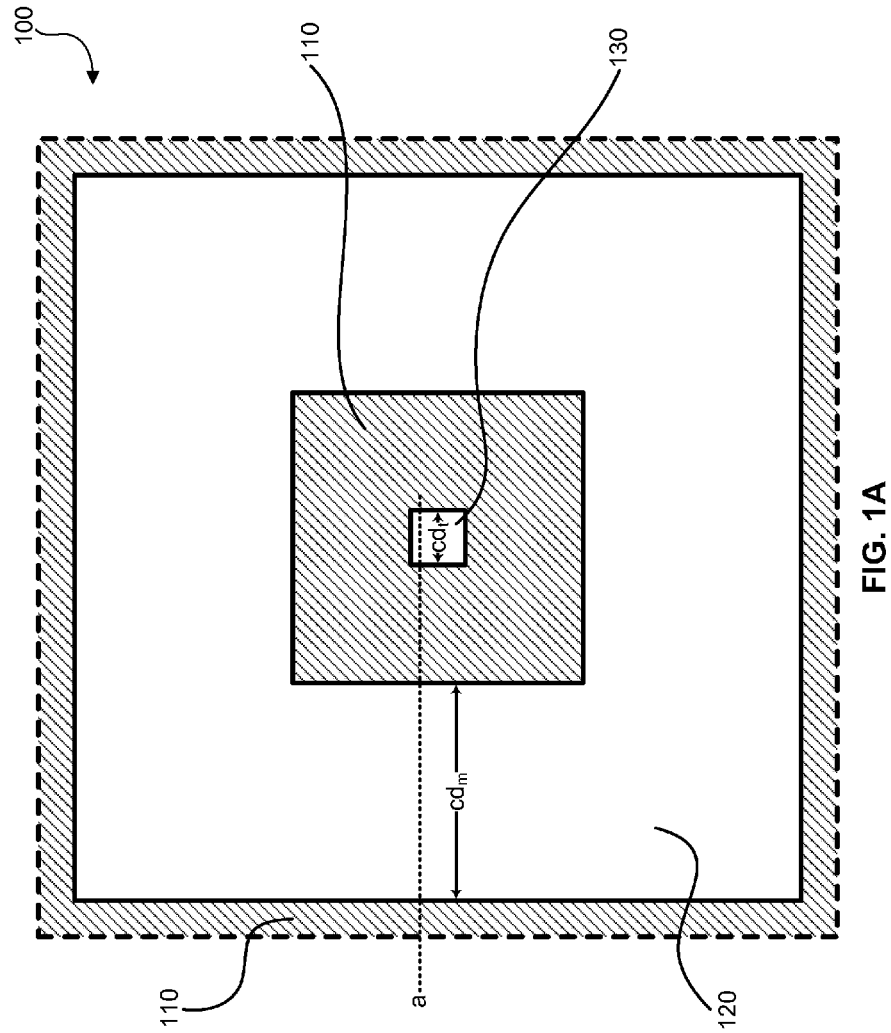
FIG. 1A depicts a top-down view of an exemplary structure formed by one embodiment of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

FIG. 1A depicts an exemplary structure 100 formed by one embodiment of the present invention. Exemplary structure 100 includes features necessary to construct embedded dynamic random access memory (eDRAM) in a semiconductor substrate. Visible in this figure are a stack of layers 110 containing a moat 120 and a trench 130. For illustrative purposes, only one trench 130 is shown. However, structures formed by one embodiment of the invention may contain a multitude of trenches requiring isolation surrounded by a single moat. Trench 130 has a critical dimension of $cd_t$. In exemplary structure 100, $cd_t$ may be approximately 70 nanometers (nm). Moat 120 has a critical dimension of $cd_m$. In this exemplary structure, $cd_m$ may be approximately 250 nm. These dimensions are for illustrative purposes only and other embodiments may include trenches and moats of different dimensions. Typically $cd_m$ may be greater than $cd_t$. Other embodiments may include structures that are different from structure 100, so long as they include two differently sized features to be etched.

Figure 1B:
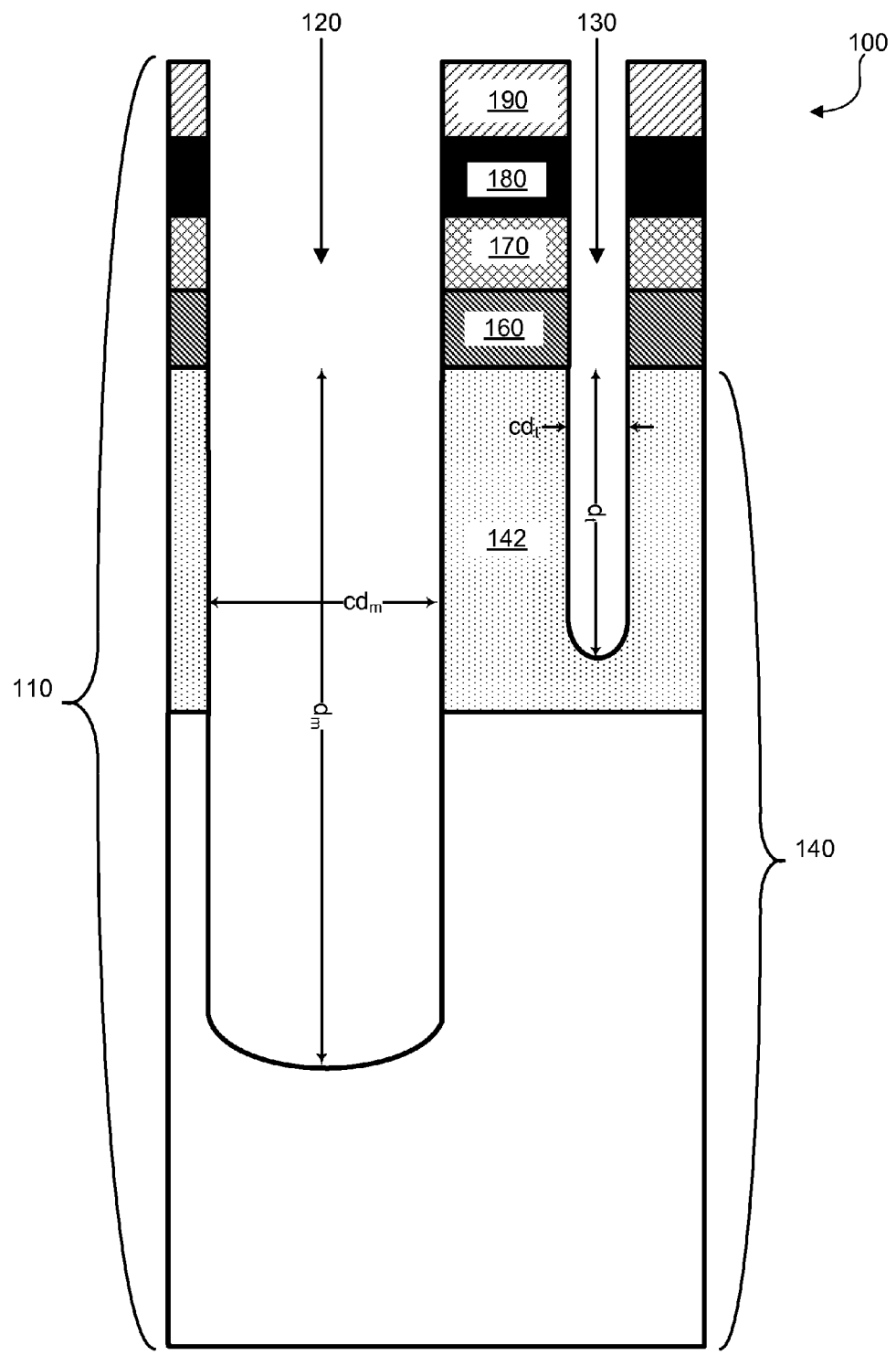
FIG. 1B depicts a cross-sectional view of the structure of FIG. 1A.

FIG. 1B depicts a cross-sectional view of exemplary structure 100 of FIG. 1A as indicated by line a in FIG. 1A. Stack of layers 110 is shown to include semiconductor substrate 140, buried oxide (BOX) layer 160, semiconductor-on-insulator (SOI) layer 170, nitride layer 180, and silicon oxide layer 190. In one embodiment, substrate 140 may be made of a semiconductor material such as silicon, silicon-germanium alloy, or silicon-carbon alloy, and may include an undoped layer 141 and a doped layer 142. In one embodiment, doped layer 142 may be approximately 3.5 micrometers (μm) thick, BOX layer 160 may be approximately 140 nm thick, SOI layer 170 may be approximately 88 nm thick, nitride layer 180 may be approximately 100 nm thick, and silicon oxide layer 190 may be approximately 1 um thick.

Visible in FIG. 1B are cross sections of moat 120 and trench 130. Moat 120 extends into substrate 140 and has a depth of $d_m$, measured from the bottom of the BOX layer 160. Trench 130 has a depth of $d_t$ also measured from the bottom of the BOX layer 160. Typically, depth $d_m$ is greater than depth $d_t$. In the depicted exemplary embodiment, depth $d_m$ may be at least 5 μm, but preferably approximately 5.5 μm, and depth $d_t$ may be about 3.5 μm. While trench 130 is shown not extending beyond the bottom of doped layer 142, other embodiments of the invention may result in trenches that extend into undoped layer 141.

Figure 2C:
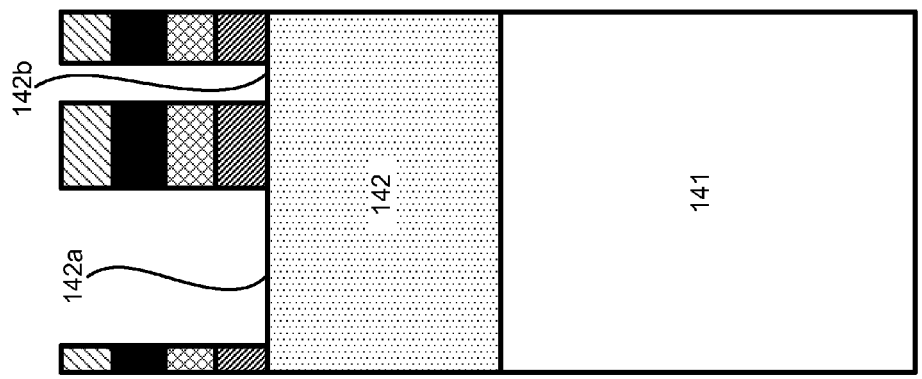
FIGS. 2A-2E depict steps in a method of forming the structure of FIG. 1A according to one embodiment of the invention.
Figure 2B:
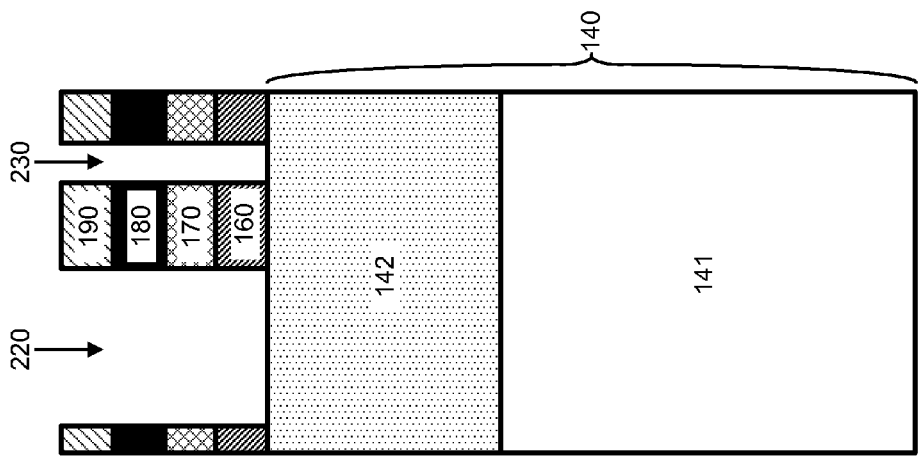
Figure 2A:
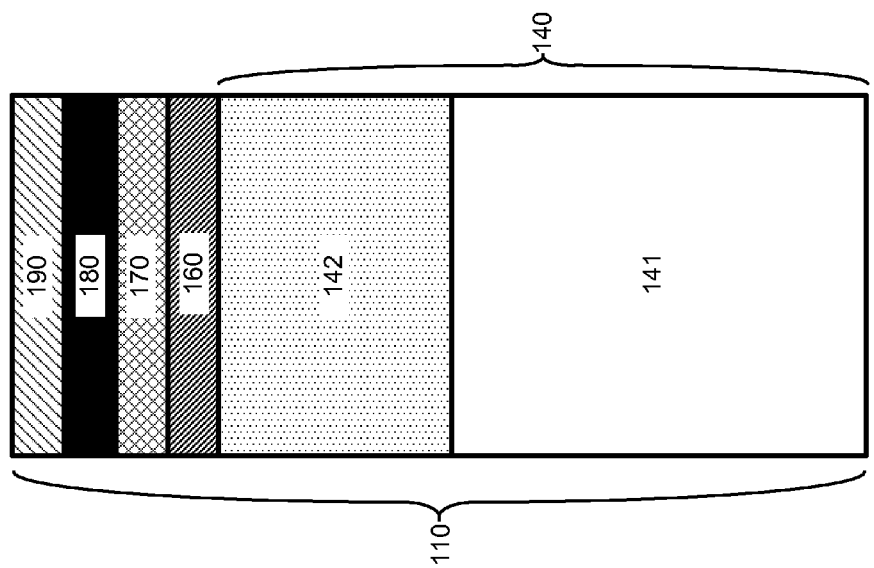

FIGS. 2A-2E depict a method of forming exemplary structure 100, according to one embodiment of the invention. FIG. 2A depicts stack of layers 110 as provided, including undoped layer 141, doped layer 142, BOX layer 160, SOI layer 170, nitride layer 180, and silicon oxide layer 190.

First, as depicted in FIG. 2B, openings 220 and 230 may be formed in BOX layer 160, SOI layer 170, nitride layer 180, and silicon oxide layer 190. These openings may be formed by dielectric etching processes commonly known in the art. In some embodiments, the process of forming openings 220 and 230 may also remove some material from substrate 140.

Next, as depicted in FIG. 2C, reactive ion etching is used to begin forming moat 120 and trench 130 (as depicted in FIG. 1B). First, surfaces 142a and 142b of doped layer 142 are etched in a multi-frequency diode capacity coupled plasma chamber (CCPC) with a first etching gas. In one embodiment, the CCPC preferably uses a bias power of 0.1 to 0.25 watts/centimeter$^3$ (W/cm$^3$) and a source power of 0.35 to 0.65 W/cm$^3$ and an operating pressure of 50 to 150 mTorr. In one embodiment, the first etching gas may include 74 vol. % to 89 vol. % hydrogen bromide (HBr), 6 vol. % to 12 vol. % nitrogen trifluoride (NF$_3$), and 5 vol. % to 16 vol. % oxygen (O$_2$). As shown in the depicted exemplary embodiment of FIG. 2D, the etching process continues using the first etching gas to begin forming moat 120 and trench 130 until trench 130 has a depth $d_1$ of approximately 1 μm. The endpoint of the first etch is dependent on the relative dimensions of the two features to be formed and will vary accordingly.

Figure 2E:
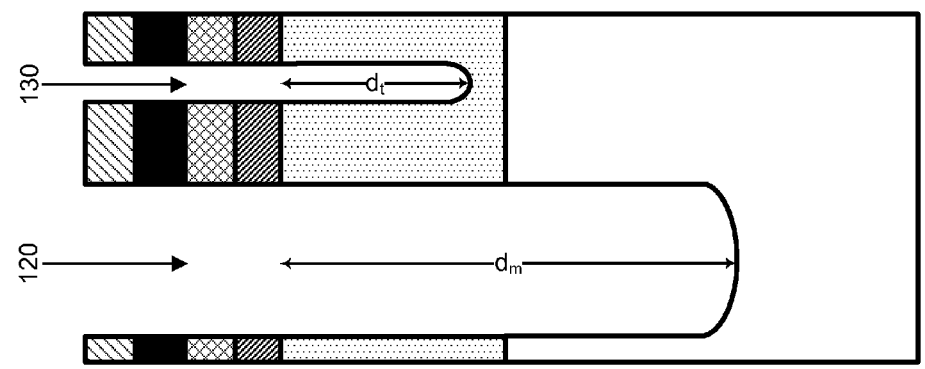
Figure 2D:
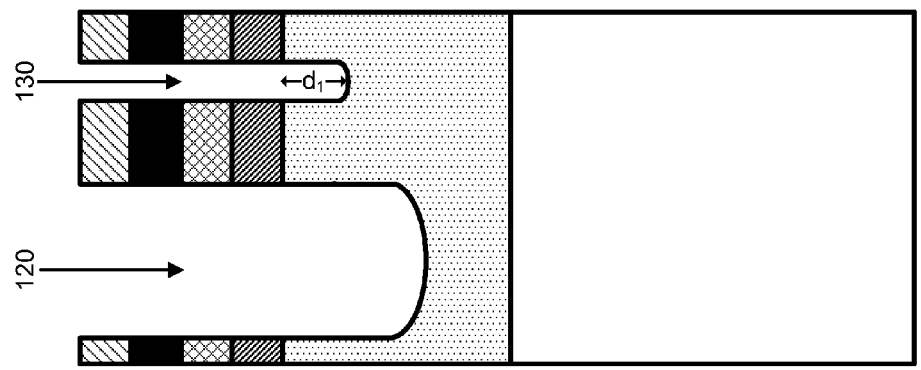

When the depth of trench 130 reaches depth $d_1$, the first etching gas is replaced with a second etching gas while maintaining the same bias power, source power, and operating pressure. The second etching gas preferably includes HBr, NF$_3$, O$_2$, and a halogenated silicon compound. In one embodiment, the halogenated silicon compound may be silicon tetrafluoride (SiF$_4$). Other embodiments may use other compounds including, for example, silicon tetrachloride (SiCl$_4$). In one embodiment, the second etching gas may include 70 vol. % to 89 vol. % HBr, 5 vol. % to 12 vol. % NF$_3$, 4 vol. % to 16 vol. O$_2$%, and less than 6 vol. % SiF$_4$. As depicted in FIG. 2E, the etching process continues using the second etching gas to finish forming moat 120 and trench 130, which occurs when moat 120 reaches its target depth of $d_m$ and trench 130 reach its target depth of $d_t$. The presence of a halogenated silicon compound in the second etching gas, such as SiF$_4$, presents several advantages over continuing the etching process without it. The addition of SiF$_4$ results in a faster etch rate in moat 120, so that the final depth $d_m$ of moat 120 is deeper relative to depth $d_t$ of trench 130 when compared to an etch process without the addition of a halogenated silicon compound. Additionally, the addition of SiF$_4$ results in a rounder bottom of trench 130, which is preferable when forming trench capacitors compared to trenches with pointed bottoms. Finally, the addition of SiF4 conserves silicon oxide layer 190.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming a first feature and a second feature in a substrate, the method comprising:
   providing a stack of layers comprising a substrate layer, a buried oxide (BOX) layer on the substrate layer, a semiconductor-on-insulator (SOI) layer on the BOX layer, a nitride layer on the SOI layer, and a silicon oxide layer on the nitride layer;
   forming a first opening in the silicon oxide layer, the nitride layer, the SOI layer, and the oxide layer;
   forming a second opening in the silicon oxide layer, the nitride layer, the SOI layer, and the oxide layer, wherein the second opening has a smaller cross-sectional area than the first opening;
   etching the first opening to form a first feature and the second opening to form a second feature with a first etching gas;
   etching the first feature and the second feature with a second etching gas, wherein the first feature is deeper than the second feature and the second etching gas comprises the first etching gas and a halogenated silicon compound.

2. The method of claim 1, wherein the substrate layer comprises a material selected from the group consisting of silicon, silicon-germanium alloys, and silicon-carbon alloys.

3. The method of claim 1, wherein the substrate layer includes a doped region.

4. The method of claim 3, wherein the doped region is approximately 3.5 micrometers (μm) thick.

5. The method of claim 1, wherein the BOX layer is approximately 140 nanometers (nm) thick.

6. The method of claim 1, wherein the SOI layer is approximately 90 nm thick.

7. The method of claim 1, wherein the nitride layer is approximately 100 nm thick.

8. The method of claim 1, wherein the silicon oxide layer is approximately 1 μm thick.

9. The method of claim 1, wherein etching the first opening and the second opening comprises reactive ion etching.

10. The method of claim 1, wherein the first etching gas comprises hydrogen bromide (HBr), nitrogen trifluoride (NF$_3$), and oxygen (O$_2$).

11. The method of claim 10, wherein the first etching gas comprises 74 vol. % to 89 vol. % HBr, 6 vol. % to 12 vol. % NF$_3$, and 5 vol. % to 16 vol. % O$_2$.

12. The method of claim 1, wherein the halogenated silicon compound of the second etching gas comprises a compound selected from the group consisting of silicon tetrafluoride and silicon tetrachloride.

13. The method of claim 1, wherein the second etching gas comprises 70 vol. % to 89 vol. % HBr, 5 vol. % to 12 vol. % NF$_3$, 4 vol. % to 16 vol. O$_2$%, and 0 vol. % to 6 vol. % SiF$_4$.

14. The method of claim 1, wherein etching the first opening and the second opening occurs in a multi-frequency diode capacity coupled plasma chamber.

15. The method of claim 12, wherein the multi-frequency diode capacity coupled plasma chamber operates at a bias power of 0.1 to 0.25 watts/centimeter$^3$ (W/cm$^3$), a source power of 0.35 to 0.85 W/cm$^3$, and an operating pressure of 50 to 150 millitorr.

* * * * *